United States Patent [19]

Teleki et al.

[11] Patent Number: 5,004,991
[45] Date of Patent: Apr. 2, 1991

[54] LOW PASS FILTER SYSTEM FOR AN ELECTRICAL CIRCUIT

[75] Inventors: Béla Teleki, Newcastle under Lyme, United Kingdom; Alan G. Holden, Chesire, England; Leang H. Chong, Penang, Malaysia

[73] Assignee: Johnson Matthey Public Limited Company, London, England

[21] Appl. No.: 33,969

[22] Filed: Apr. 3, 1987

[30] Foreign Application Priority Data

Apr. 4, 1986 [UK] United Kingdom ............. 8608298

[51] Int. Cl.$^5$ ............................................. H03H 7/075
[52] U.S. Cl. ...................................... 333/168; 333/12; 333/138; 333/167
[58] Field of Search ........... 333/12, 167, 168, 138–140

[56] References Cited

U.S. PATENT DOCUMENTS 2,760,167  8/1956  Hester et al. ...................... 333/167
3,514,727  5/1970  Matsumoto et al. ................ 333/167
4,437,075  3/1984  Darmouni .......................... 333/167

*Primary Examiner*—Eugene R. Laroche
*Assistant Examiner*—Seung Ham
*Attorney, Agent, or Firm*—Cushman, Darby & Cushman

[57] ABSTRACT

A low pass filter system for filtering from an electrical circuit unwanted high frequency signals while allowing passage to a passband of wanted signals of lower frequency wherein the filter system comprises a low pass filter (1) and a group delay equalizer made up of at least two group delay means (2,3) each of which imparts delay to substantially all of the passband signals. It has been found that by sharing the group delay function between two or more group delay means enables a much higher degree of group delay equalization to be achieved with filters having a transition sharpness of below 1.17.

7 Claims, 2 Drawing Sheets

LOW PASS FILTER SYSTEM FOR AN ELECTRICAL CIRCUIT

This invention relates to a low pass filter system for filtering from an electrical circuit unwanted signals having a frequency above a pre-selected value.

Commercial low pass filter systems contain a low pass filter which comprises one or more inductances and capacitances tuned to suppress the unwanted signals whilst allowing passage of a band of wanted signals usually called the "passband" of signals. A difficulty arises because the filter delays the passband of signals (that is to say it slows down the speed with which the signals pass through the filter) and the amount of the delay is different for signals of different frequencies. Briefly the delay increases with frequency so that (at least in principle) the signal having the highest frequency suffers the greatest delay whilst those having lower frequencies suffer lesser delays. This means that signals having neighbouring frequencies become out of phase. Out of phase signals distort any information which they may be carrying and in particular in radio and video circuits they distort the sound and pictures reproduced from the signals. Therefore to be commercially successful a low pass filter system must contain a device for tackling this problem of loss of phase synchronism.

Loss of phase synchronism can be overcome by using an extra inductance to impart a sufficient amount of extra delay to each of the lower frequency signals so as to increase the total delay suffered by each signal until the delay equals the delay suffered by the signal of highest freqeuncy. In this way the delay suffered by each of the signals is equalised and their phases are accordingly restored to synchronism. Except when the wanted signals have frequencies extending across only a narrow band, a single inductance alone is not enough to impart the required amount of extra delay to signals of every frequency. Therefore a device known as a group delay equaliser is used to impart the required delays. A group delay equaliser comprises a plurality of (usually 2 to 6) combinations of inductance and capacitance and each combination is tuned to influence one particular band or "group" of the signals of the passband. Therefore the passband receives its extra delay not from a single inductance but from the cumulative affect of all the inductances in the group delay equaliser. In practice a group delay equaliser cannot produce a perfect equalisation of all the delays, but a good equaliser will ensure that after equalisation the delay associated with the most delayed signal will not be more than 20 nano seconds (ns) greater than the delay associated with the least delayed signal. This difference is known as the group delay ripple factor and it can be as little as 10 to 15 ns for at least 90% of the passband frequencies. Existing commercial group delay equalisers work well when used with low pass filters which have a transition sharpness (as hereinafter defined) of not less than 1.17 but existing equalisers cannot reliably produce acceptable ripple factors in the region of the frequency cut-off if the transition sharpness is below 1.17. Therefore it is one of the objects of this invention to provide a low pass filter system comprising improved group delay equalisation means and especially means which are suitable for use with filters having a transition sharpness of below 1.17, preferably within the range 1.03 to 1.17.

To define "transition sharpness" clearly, it is first necessary to explain that in an ideal low pass filter the cut-off between those signals which are allowed to pass and those which are filtered should occur at a single frequency so giving a perfectly sharp cut-off (or "passband edge" as it is sometimes called). In practice perfection is not achieved and the cut-off occurs not at a single frequency but over a narrow band of neighbouring frequencies. Signals having the lower frequencies in this cut-off band are filtered only to the extent that they suffer a small reduction in amplitude whilst those having the higher frequencies within the band suffer major loss of amplitude. A measure of the sharpness of the cut-off is given by the "transition sharpness" which is defined as the ratio $f_2/f_1$ where $f_1$ is the frequency at which filtering commences and $f_2$ is the frequency at which filtering reaches its maximum.

This invention provides a low pass filter system for filtering from an electrical circuit unwanted signals having a frequency above a pre-selected frequency whilst allowing passage to a passband of signals whose frequency is below the pre-selected frequency, the system comprising a low pass filter and a first group delay means which comprises a plurality of (usually 2 to 6) combinations of inductance and capacitance, each combination being tuned to effect a particular group of the passband of signals such that the cumulative affect of the combinations is to impart delay to at least 90% of the passband of signals wherein the low pass filter system also comprises at least one (and preferably 1 to 4) additional group delay means comprising a plurality of combinations of inductance and capacitance, each being tuned to affect a particular group of the passband of signals such that the cumulative effect of the combinations is to impart delay to at least 90% of the passband of signals and the cumulative affect of the first and additional group delay means is to impart sufficient delay to the passband of signals to bring the delay suffered by at least 90% of the passband of signals to within 20 ns of the delay suffered by the passband signal having the highest frequency. It has been discovered that by sharing the group delay equalisation between at least two group delay means, it is possible to achieve a higher degree of equalisation and in particular a degree of equalisation which can provide acceptable group delay ripple factors when used with low pass filters having a transition sharpness of below 1.17, for example 1.04 to 1.16.

The low pass filter systems of this invention are primarily intended for use with radio and video circuits, that is to say circuits which may be receiving signals of from 50 kHz to 40 MHz. Very often the pre-selected cut-off frequency will lie in the range 2 to 10 MHz.

The low pass filter system will usually be used in combination with a typical amplitude equaliser of the type used with filters to equalise the loss in amplitude suffered by passband signals of different frequencies as they pass through the filter system. Generally it is preferred to ensure that the variation in amplitude is less than 0.1 dB, that is to say the factor $20 \log_{10} V_1/V_2$ (where $V_1$ and $V_2$ are the maximum and minimum voltages of the output signals for constant voltage input signals) should be less than 0.1.

Figure 1:
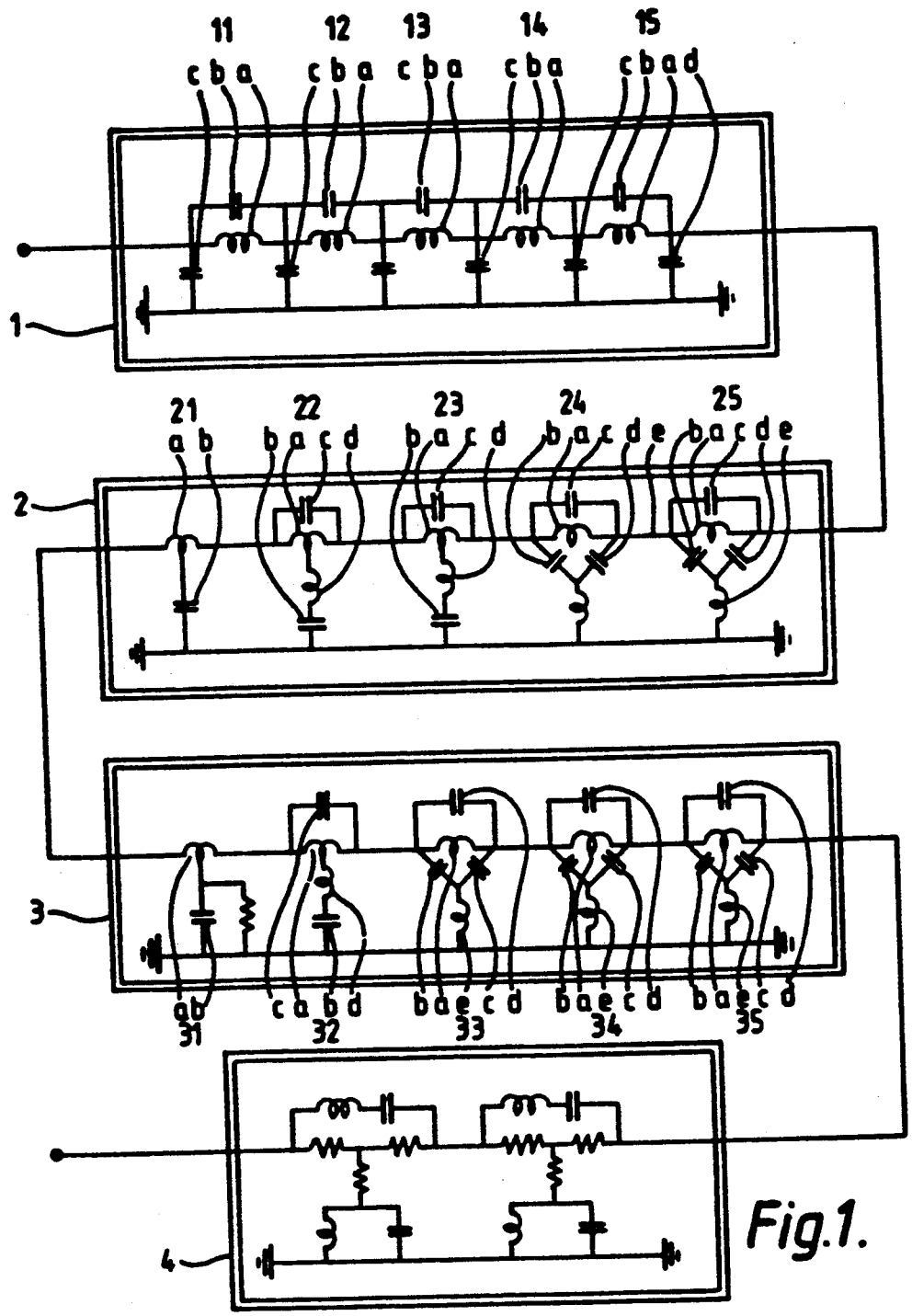
FIG. 1 shows a circuit diagram for a low pass filter system according to this invention.

FIG. 1 shows a low pass filter system consisting of a low pass filter 1 in series with two group delay equalisation means 2 and 3 and a typical amplitude equaliser 4. Filter 1 contains five combinations of inductance and capacitance namely 11a, 11b, 11c and 12c, 12a, 12b, 12c and 13c, 13a, 13b, 13c and 14c, 14a, 14b, 14c and 15c and 15a, 15b, 15c and 15d. Group delay means 2 and 3 each contain five combinations of inductance and capacitance, namely 21a and 21b, 31a and 31b, 22a, 22b, 22c and 22d, 32a, 32b, 32c and 32d, 23a, 23b, 23c and 23d, 33a, 33b, 33c, 33d and 33e, 24a, 24b, 24c, 24d and 24e, 34a, 34b, 34c, 34d and 34e, 25a, 25b, 25c, 25d and 25e and 35a, 35b, 35c, 35d and 35e. Each of these combinations is tuned to affect one particular group of signals. Taken together, the combinations 21 to 25 of group delay means 2 impart delay to substantially all the passband of signals passing through the system. However the delay imparted by group delay means 2 is less than the amount needed to cause the delays suffered by the signals having frequencies below the highest frequency in the wanted signals to become about equal to the delay suffered by the signal of highest frequency. The effect produced by group delay means 3 is analogous to that produced by group delay means 2 and the cumulative effects of means 2 and 3 is such as to ensure that over at least 90% of the passband, the delays suffered by the passband of signals is at least within 20 ns of the delay suffered by the passband signal having the highest frequency. Amplitude equaliser 3 is a typical device which ensures that the variation in amplitude of the passband signals does not exceed 0.1 dB. The system shown in FIG. 1 can be used with a low pass filter having a "transmission sharpness" of 1.04.

Figure 2:
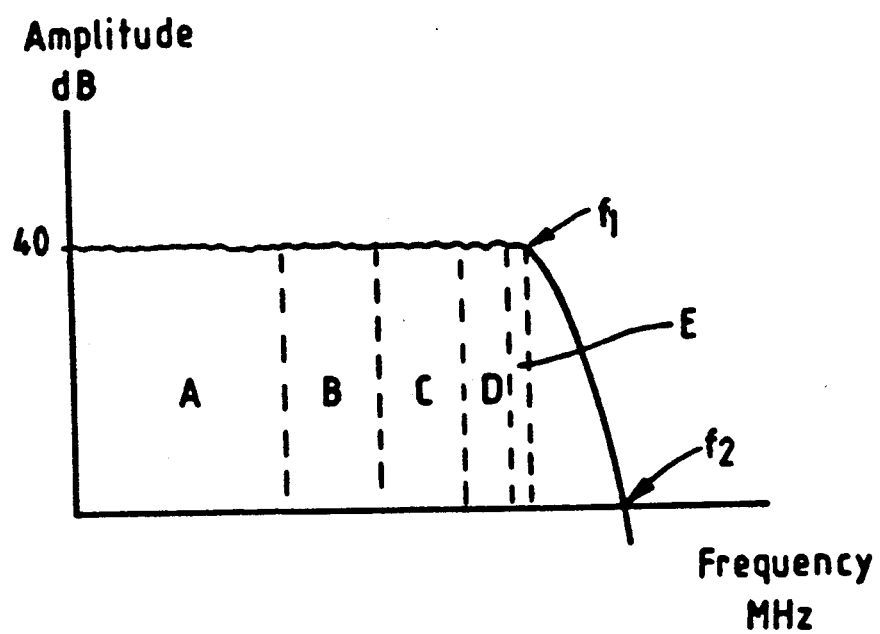
FIG. 2 shows a graph of amplitude versus frequency for the signals emerging from the system shown in FIG. 1.

FIG. 2 shows that the amplitude for the passband of signals (that is to say signals having a frequency below a pre-selected frequency of $f_1$ as shown in FIG. 2) varies by less than 0.1 dB and then at $f_1$ the amplitude begins to fall reaching 40 dB below the average passband amplitude at $f_2$. Therefore filtering begins in the wave bend $f_1$ to $f_2$. FIG. 2 also indicates the groups A to E of signals which are primarily affected by combinations 21 to 25 or 31 to 35 respectively.

The components of the filter system shown in FIG. 1 are arranged in series in the order filter 1, group delay means 2 and 3 and amplitude equaliser 4. However the components could be arranged in series in any different order.

What is claimed is:

1. A low pass filter system for filtering from an electrical circuit unwanted signals having a frequency above a pre-selected frequency whilst allowing passage to a passband of signals whose frequency is below the pre-selected frequency, the system comprising:

a low pass filter having an input and a filtered output;

a first group delay means having an input connected to the filtered output of the filter and having an output, said first group delay means comprises a plurality of combinations of inductance and capacitance elements, each said combination being tuned to affect a particular frequency group of the passband of signals such that the cumulative effect of the combination is to impart a delay to at least 90% of said passband of signals passing through said first group delay means; and at least one additional group delay means having an input connected to the output of the first group delay means and having an output, said additional group delay means comprising a plurality of combinations of inductance and capacitance elements, each said combination being tuned to affect a particular frequency group of the passband of signals such that the cumulative effect of the combinations is to impart delay to at least 90% of the passband of signals and the cumulative effect of the first and the additional group delay means together is to impart sufficient extra delay to said passband of signals at the output of the additional group delay means to bring the delay provided to at least 90% of the wanted signals to within 20 ns of the delay provided to the passband signal having a highest frequency.

2. A system as claimed in claim 1 wherein the system comprises between one and four of said additional group delay means connected in series to one another.

3. A system as claimed in claim 2 wherein the system comprises only one of said additional group delay means.

4. A system as claimed in any one of the proceeding claims wherein each group delay means comprises between two and five of said combinations of inductance and capacitance elements, each said combination being tuned to affect a particular frequency group of the passband of signals passing through said group delay means.

5. A system according to claim 4 wherein the low pass filter has a transition sharpness of less than 1.17.

6. A system according to claim 5 wherein the transition sharpness is between 1.03 and 1.17.

7. A system according to any one of claims 1-3 further comprising an amplitude equalization device connected in series to the output of the additional group delay means.

* * * * *